United States Patent
Agarwal

(10) Patent No.: US 10,999,050 B1
(45) Date of Patent: May 4, 2021

(54) METHODS AND APPARATUS FOR DATA SYNCHRONIZATION IN SYSTEMS HAVING MULTIPLE CLOCK AND RESET DOMAINS

(71) Applicant: STMicroelectronics International N.V., Geneva (CH)

(72) Inventor: Samiksha Agarwal, New Delhi (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 16/865,914

(22) Filed: May 4, 2020

(51) Int. Cl.
*H04L 7/00* (2006.01)

(52) U.S. Cl.
CPC .......... *H04L 7/0041* (2013.01); *H04L 7/0012* (2013.01)

(58) Field of Classification Search
None
See application file for complete search history.

(56) References Cited

U.S. PATENT DOCUMENTS

| | | |
|---|---|---|
| 5,487,092 A | 1/1996 | Finney et al. |
| 6,333,893 B1 | 12/2001 | Keeth et al. |
| 6,980,479 B2 | 12/2005 | Park |
| 8,212,594 B2 * | 7/2012 | Singhal .............. G06F 5/06 327/144 |
| 10,014,041 B1 * | 7/2018 | Khare .............. G11C 7/222 |
| 2013/0343441 A1 | 12/2013 | Alfieri |

OTHER PUBLICATIONS

Verma, Saurabh, et al., "Understanding Clock Domain Crossing Issues," EE Times, Design Lines, www.eetimes.com/designline/soc-designline/, Dec. 24, 2007, 9 pages.

* cited by examiner

*Primary Examiner* — Jeffery S Zweizig
(74) *Attorney, Agent, or Firm* — Slater Matsil, LLP

(57) ABSTRACT

A data synchronization unit including first flip-flops, operating on a first clock domain and a reset of a second clock domain, sampling data from the first clock domain; a second flip-flop, operating in the first clock domain, sampling a request signal when enabled by a request pulse; a request signal path configured to delay the request signal by a first delay and to generate an enable signal for recirculation multiplexers in accordance with the delayed request signal; a reset signal synchronization path configured to delay the reset signal of the first clock domain by a second delay, wherein the second delay is shorter than the first delay; and multiplexers having first inputs for receiving outputs of the recirculation multiplexers, a second input for receiving a reset value of a programmable register, the multiplexers being configured to selectively output signals at inputs to outputs.

20 Claims, 8 Drawing Sheets

METHODS AND APPARATUS FOR DATA SYNCHRONIZATION IN SYSTEMS HAVING MULTIPLE CLOCK AND RESET DOMAINS

The present invention relates generally to apparatus and methods for data synchronization in systems having multiple clock and reset domains.

BACKGROUND

A conventional two flip-flop synchronizer 100 is used for synchronizing a single bit level signal $Sig_1$ as is shown in FIG. 1. Flip-flop A 105 operates in the clock A domain 107 and flip-flops B1 110 and B2 112 operate in the clock B domain 114. Clock A domain 107 and clock B domain 114 are asynchronous clock domains. Flip-flop A 105 receives the input signal $Sig_1$ at the "D" input and is clocked by the first clock signal $CLK_1$ at the clock input. The input signal $Sig_1$ is transferred to the "Q" output of flip-flop A 105 by the action of the first clock signal $CLK_A$ as is known in the art. Flip-flops B1 110 and B2 112 are clocked by the second clock signal $CLK_B$, and the output signal at the "Q" output of flip-flop A 105 is serially transferred through each of flip-flops B1 110 and B2 112 to the final "Q" output at output node 120.

FIG. 2A shows a first timing diagram 200 of the exemplary conventional synchronizer 100 shown in FIG. 1. Waveforms associated with the $CLK_A$ signal (trace 205), the "Q" output of flip-flop A (trace 207), the $CLK_B$ signal (trace 209), the "Q" output of flip-flop B1 (trace 211), and the "Q" output of flip-flop B2 (trace 213) are shown. There is a probability that while sampling the input "D" input by flip-flop B1 in the $CLK_B$ clock domain, the "Q" output of flip-flop B1 may go into metastable state 215. But during the one clock cycle period of the $CLK_B$ clock signal associated with the metastable state 215, the output "Q" output of flip-flop B1 may settle to some stable value (in the case shown in FIG. 2A, the stable value is a logic one value). The output of flip-flop B2 can also go to metastable state if flip-flop B1 does not settle to a stable value during the one clock cycle period associated with the metastable state 215, but the probability for flip-flop B2 to be metastable for a complete clock cycle is very close to zero.

If the frequency of $CLK_B$ is too high, the output of flip-flop B1 may not settle to a stable value by the time that flip-flop B2 samples the output of flip-flop B1. In such a situation, a three flip-flop synchronizer may be used in place of the two flip-flop synchronizer to allow more time for the metastable signal to stabilize.

FIG. 2B illustrates a second timing diagram 250 associated with the exemplary convention synchronizer 100 of FIG. 1. Waveforms associated with the $CLK_A$ signal (trace 255), the "Q" output of flip-flop A (trace 257), the $CLK_B$ signal (trace 259), the "Q" output of flip-flop B1 (trace 261), and the "Q" output of flip-flop B2 (trace 263) are shown. Timing diagram 250 illustrates a phenomenon associated with multi-flip-flop synchronizers referred to as cycle uncertainty. In cycle uncertainty, an additional clock cycle of the destination clock may be needed to synchronize a source signal (the output of flip-flop A 105) to the destination clock domain. Cycle uncertainty may be dependent upon whether or not the output of an intermediate flip-flop settles to a correct logic value. As shown in FIG. 2A, two active clock edges of the destination clock are required to synchronize the source signal in the destination clock domain. This is because the output of flip-flop B1 110 settled to the correct logic level 1 after metastable state 215. However, as shown in FIG. 2B, the output of flip-flop B1 110 settled to an incorrect logic level 0 after metastable state 265. Due to this incorrect behavior, an extra destination clock cycle is needed to synchronize the source signal in the destination clock domain. Therefore, there is uncertainty regarding synchronization requiring two clock cycles or three clock cycles of the destination clock.

SUMMARY

In accordance with an embodiment, a data synchronization unit is provided. The data synchronization unit includes first flip-flops having an input for receiving data from a first clock domain, a reset coupled to a reset signal of a second clock domain, and an output for providing sampled data, the first flip-flops being enabled by a request enable signal; a second flip-flop having an input coupled to an inverted output of the second flip-flop, an output for providing a request signal, and a reset coupled to a reset signal of the first clock domain, the second flip-flop being enabled by the request enable signal; a request signal path having an input coupled to the request signal, and an output for providing an enable signal synchronized to the second clock domain, the request signal path being configured to synchronize and delay the request signal by a first delay and to generate the enable signal in accordance with the synchronized request signal; a synchronized reset signal path having an input coupled to the reset signal of the first clock domain, and an output for providing a reset signal synchronized to the second clock domain, the synchronized reset signal path being configured to synchronize and delay the reset signal of the first clock domain by a second delay, wherein the second delay is shorter than the first delay; and multiplexers having first inputs for receiving outputs of recirculation multiplexers, second inputs for receiving a reset value of a programmable register that stores data in the first clock domain, a select input for receiving the synchronized reset signal, the multiplexers being configured to selectively output signals at inputs of the multiplexers to outputs of the multiplexers.

In accordance with another embodiment, a system is provided. The system includes: a first clock domain circuit having an output for providing data clocked by a clock of a first clock domain; a second clock domain circuit having an input for receiving data from the first clock domain circuit, the received data being clocked by a clock of the second clock domain; and a data synchronization circuit operatively coupled in between the first clock domain circuit and the second clock domain circuit, the data synchronization circuit being configured to synchronize a reset signal of the first clock domain to the second clock domain and to prevent propagation of a metastable value into the second clock domain circuit In accordance with another embodiment, a method is provided. The method includes synchronizing a reset of a first clock domain to a second clock domain; and ensuring that a synchronization and delay of a request signal from the first clock domain in the second clock domain is slower than a synchronization and delay of the reset of the first clock domain in the second clock domain.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

In the ensuing description one or more specific details are illustrated, aimed at providing an understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Electronic systems such as automotive systems can be implemented as a System on a Chip (SoC) that is an integrated circuit including all of the components of the system, often including, for example, components associated with different and asynchronous clock domains. A clock domain crossing occurs when data is transferred from a flip-flop (a source flip-flop) driven by a first clock to a flip-flop (a destination flip-flop) driven by a second clock. Depending on the relationship between the clocks, problems may arise in the data transfer between the source flip-flop and the destination flip-flop. As an example, if a transition at output of the source flip-flop occurs very close to the active edge of the second clock, a setup or hold violation at the destination flip-flop may occur. This may lead to the output of the second flip-flop to oscillate, become unstable, and may not settle down to a stable value before the next active edge of the second clock. This condition is referred to as metastability.

A metastability condition may also occur when there is a reset domain crossing. A Reset domain crossing may occur when data is transferred between flip-flops operating on different resets, even if they share the same clock domain. As an example, if the reset of the source flip-flop is asserted when the destination flip-flop is sampling the data (and the reset of the destination flip-flop is not asserted), data at the input of the destination flip-flop might not meet setup or hold requirements. This may lead to a metastability condition at the output of the destination flip-flop.

Figure 1:
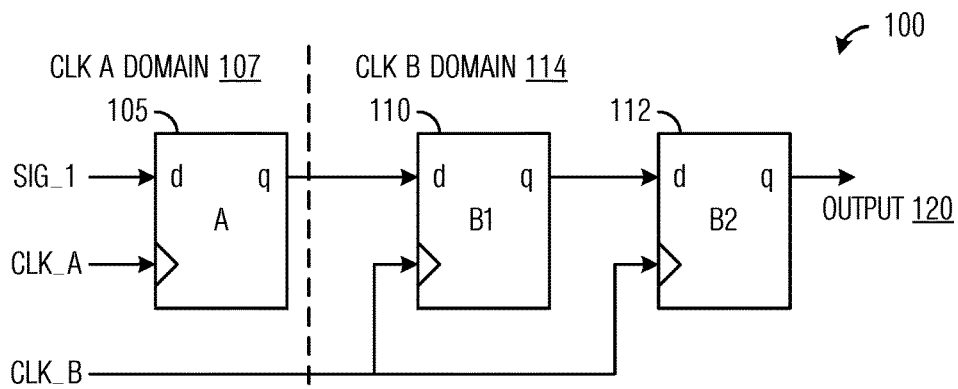
FIG. 1 illustrates a schematic diagram of an exemplary conventional synchronizer.
Figure 2A:
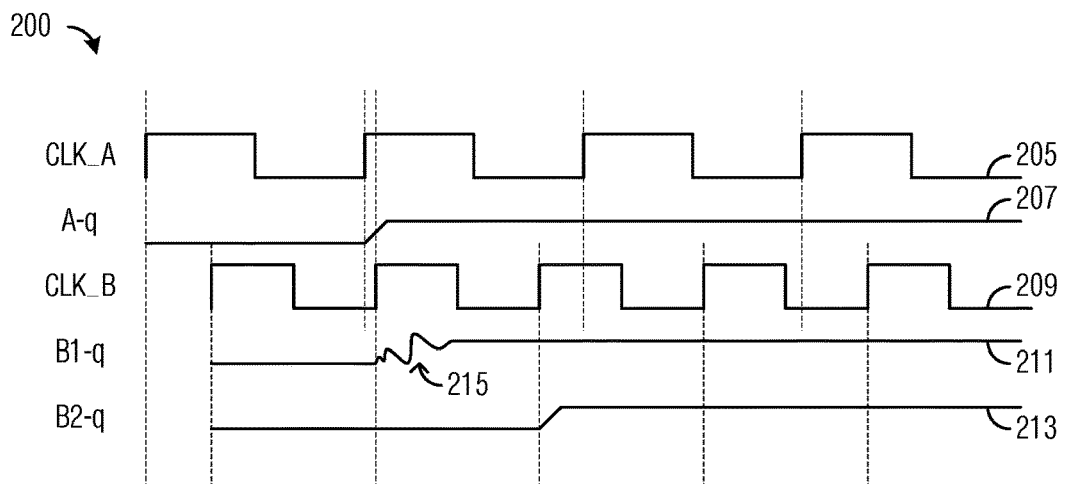
FIG. 2A illustrates a first timing diagram associated with the exemplary conventional synchronizer of FIG. 1.
Figure 2B:
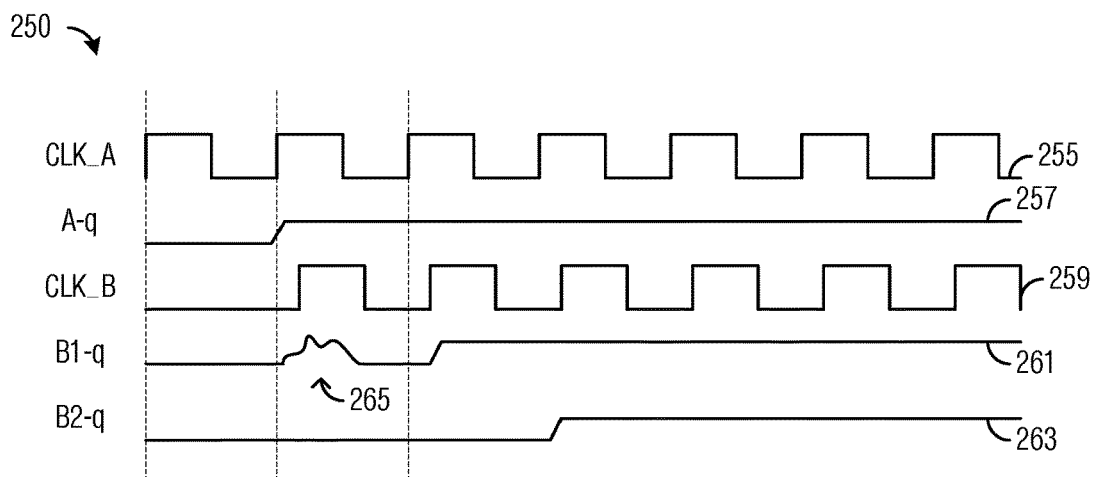
FIG. 2B illustrates a second timing diagram associated with the exemplary convention synchronizer of FIG. 1.
Figure 3:
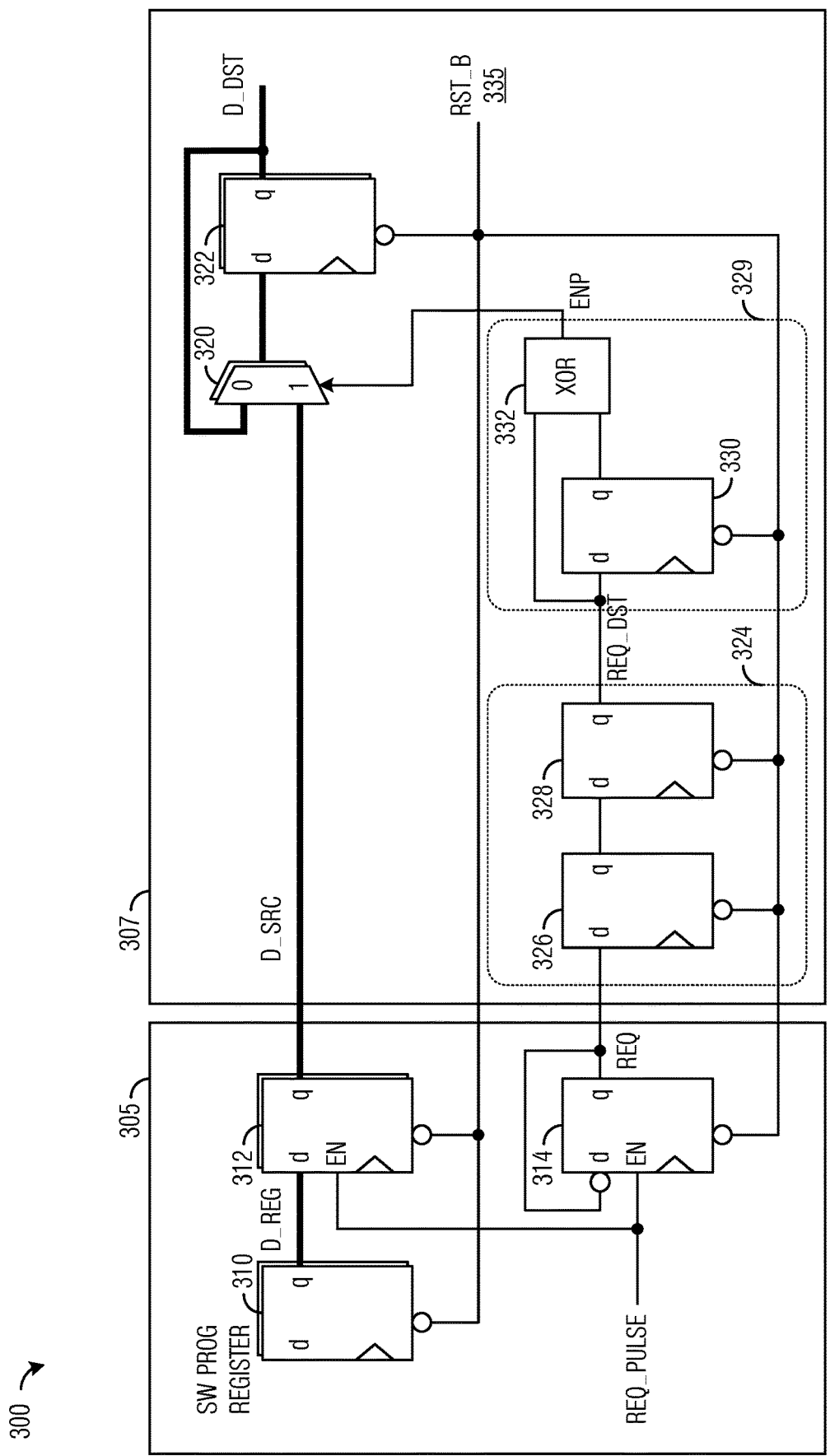
FIG. 3 illustrates a system, highlighting a prior art recirculation multiplexer (mux) technique for passing multi-bit data between clock domains.

FIG. 3 illustrates a system 300, highlighting a prior art recirculation multiplexer (mux) technique for passing multi-bit data between clock domains. As shown in FIG. 3, system 300 may be used to synchronize multi-bit data from source domain to destination domain, where it is important to maintain data coherence (i.e., all data bits must change simultaneously (or almost simultaneously, within timing differences arising from manufacturing process tolerance differences, propagation delay differences, etc.) in the destination domain. Due to this requirement, a simple multi-flip-flop synchronization scheme (such as one that is shown in FIG. 1) cannot be used to synchronize each individual data bit because cycle uncertainty (as explained previously) may lead to data-incoherence. System 300 includes two clock domains, a first clock domain 305 and a second clock domain 307. First clock domain 305 includes a software (SW) programmable register 310 that can be used to store data and flip-flops 312 used to store and hold the data stored in SW programmable register 310. SW programmable register 310 may be implemented as flip-flops, for example. The number of flip-flops in each of SW programmable register 310 and flip-flops 312 is equal to the width of the data bus. As an example, in a system with a 64-bit data bus, SW programmable register 310 may be implemented using 64 flip-flops. Similarly, flip-flops 312 may comprise 64 flip-flops.

First clock domain 305 also includes a flip-flop 314 used to generate a request signal (REQ) used to indicate that a request to read the data stored in SW programmable register 310 has been made. The request signal (REQ) may be generated from a request enable signal (REQ_PULSE), for example. The request enable signal (REQ_PULSE) is used to enable flip-flops 312 and flip-flop 314, meaning that an active signal on the request enable signal (REQ_PULSE) initiates operation of flip-flops 312 and flip-flop 314. As an example, once software writes multi-bit data to SW programmable register 310, the request enable signal (REQ_PULSE) is generated to indicate that the source multi-bit data (in first clock domain 305) is ready to be read in second clock domain 307.

Although SW programmable register 310, flip-flops 312, and flip-flop 314 are not shown as being clocked, they are being clocked by a clock common to first clock domain 305. The clock lines are omitted to simplify FIG. 3.

Second clock domain 307 includes recirculation muxes 320 that selectively outputs either the output of flip-flops 322, which is the data stored in SW programmable register 310 in second clock domain 307, or the output of flip-flops 312, dependent upon the request signal (REQ). The number of recirculation muxes 320 is equal to the width of the data bus. As an example, if the request signal is active, recirculation muxes 320 select the output of flip-flops 312 to output, while if the request signal is inactive, recirculation muxes 320 select the output of flip-flops 322 as output (in other words, recirculation muxes 320 are recirculating the output of flip-flops 322, giving rise to their name). Data stored in flip-flops 322 may not be consistent with data stored in SW programmable register 310 until an update of flip-flops 322 has occurred. Output of flip-flops 322 is the multi-bit data stored in SW programmable register 310 in second clock domain 307.

Second clock domain 307 also includes a synchronizer 324 that is configured to synchronize the request signal (REQ) to second clock domain 307, where it is referred to as request signal (REQ_DST). As shown in FIG. 3, synchronizer 324 comprises two flip-flops (flip-flop 326 and flip-flop 328). Second clock domain 307 also includes pulse generator 329. Pulse generator 329 includes flip-flop 330 and an exclusive-or (XOR) logic gate 332 with a first input coupled to the output of flip-flop 330 and a second input coupled to the input of flip-flop 330 (or equivalently, the output of flip-flop 328). Pulse generator 329 (flip-flop 330 and XOR logic gate 332) is used to generate pulses that are one destination clock cycle in duration whenever there is a change in the request signal (REQ_DST). For example, pulse generator 329 outputs a pulse whenever the request signal (REQ_DST) changes from 0 to 1 or 1 to 0. The output of pulse generator 329 is used as the select signal for recirculation muxes 320, for example.

A single reset signal (RST_B) 335 is used to reset the flip-flops in system 300. The reset signal (RST_B) 335, when active, resets the content stored in the flip-flops in system 300. Hence, although system 300 comprises two clock domains, there is only one reset domain. Flip-flops 314, 326, 328, and 330 are single flip-flops, while flip-flops 312 and flip-flops 322 are multiple flip-flop arrays, with each flip-flop arrays comprising as many flip-flops as the width of the data-bus supported by system 300. Similarly, recirculation muxes 320 is a linear array of recirculation muxes with as many recirculation muxes as the width of the data-bus.

Figure 4:
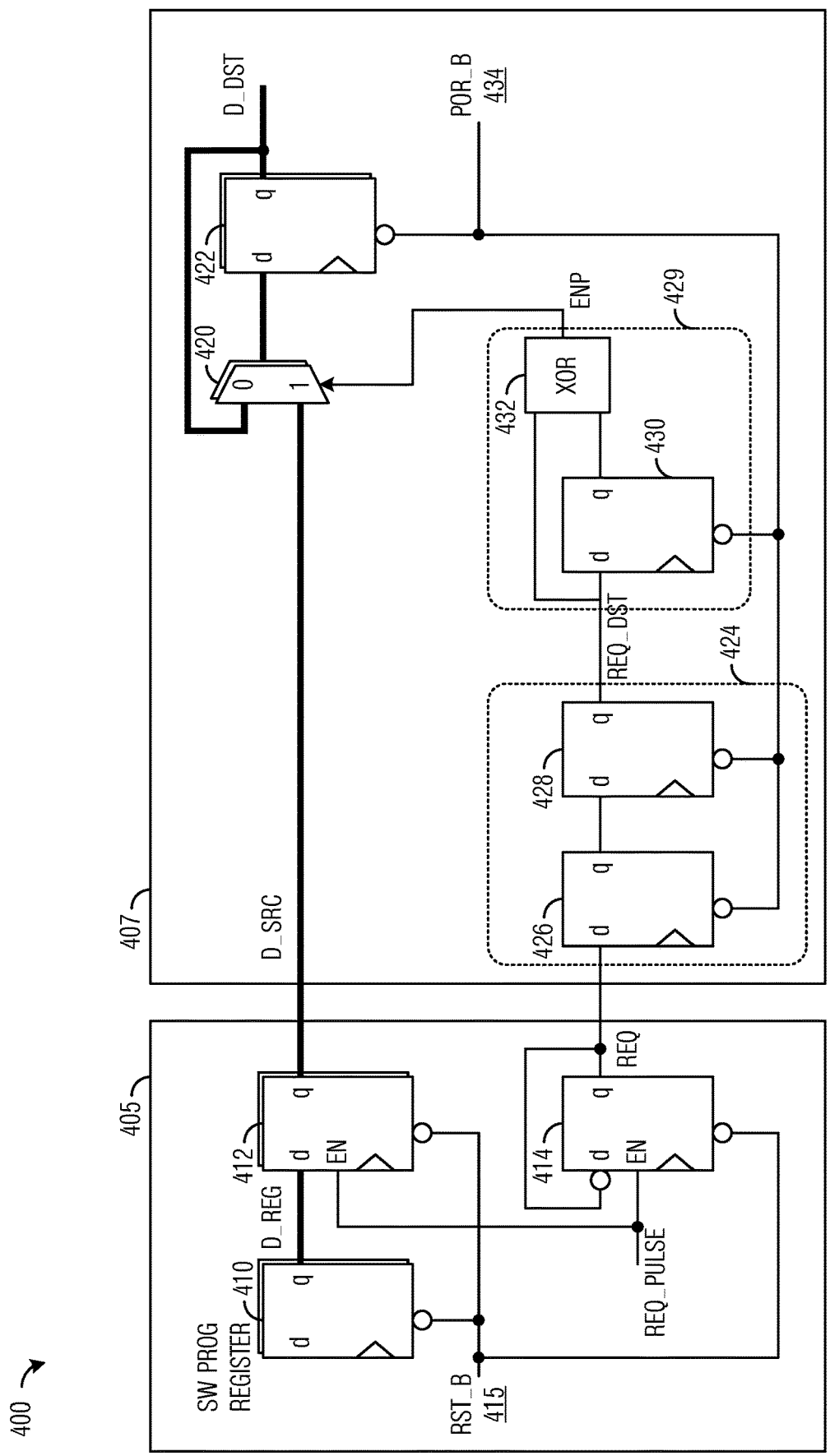
FIG. 4 illustrates a prior art system with two reset domains.

FIG. 4 illustrates a prior art system 400 with two reset domains. System 400 includes two clock domains (a first clock domain 405 and a second clock domain 407) and two reset domains (a first reset domain associated with a first reset signal (RST_B) 415 and a second reset domain associated with a second reset signal (POR_B) 434). As shown in FIG. 4, flip-flops in first clock domain 405 (SW programmable register (implemented as flip-flops, for example) 410, flip-flops 412, and flip-flop 414) are part of a first reset domain controlled by first reset signal (RST_B) 415, while flip-flops in second clock domain 407 (flip-flops 422, flip-flop 426, flip-flop 428, and flip-flop 430) are part of a second reset domain controlled by second reset signal (POR_B) 434. The first reset domain may be a part of a programming interface, while the second reset domain may be a part of a run-time interface, for example. The multiple reset domains may be needed to support operations, such as when the run-time interface measures events occurring during a functional chip reset. In such a situation, the reset values (e.g., the values of the reset flip-flops) need to be propagated correctly to the destination domain (the second clock domain 407).

Due to the two reset domain configuration of system 400, it is possible for flip-flops 422 to become metastable. As an example, while flip-flops 422 are sampling multi-bit data from flip-flops 412, first reset signal (RST_B) 415 may be asserted, resulting in the multi-bit data from flip-flops 412 (D_SRC) changing within the setup or hold boundary of flip-flops 422. This may result in flip-flops 422 becoming metastable, and therefore, other circuits utilizing the multi-bit data from flip-flops 422 (D_DST) potentially becoming metastable or using a corrupted value.

Figure 5:
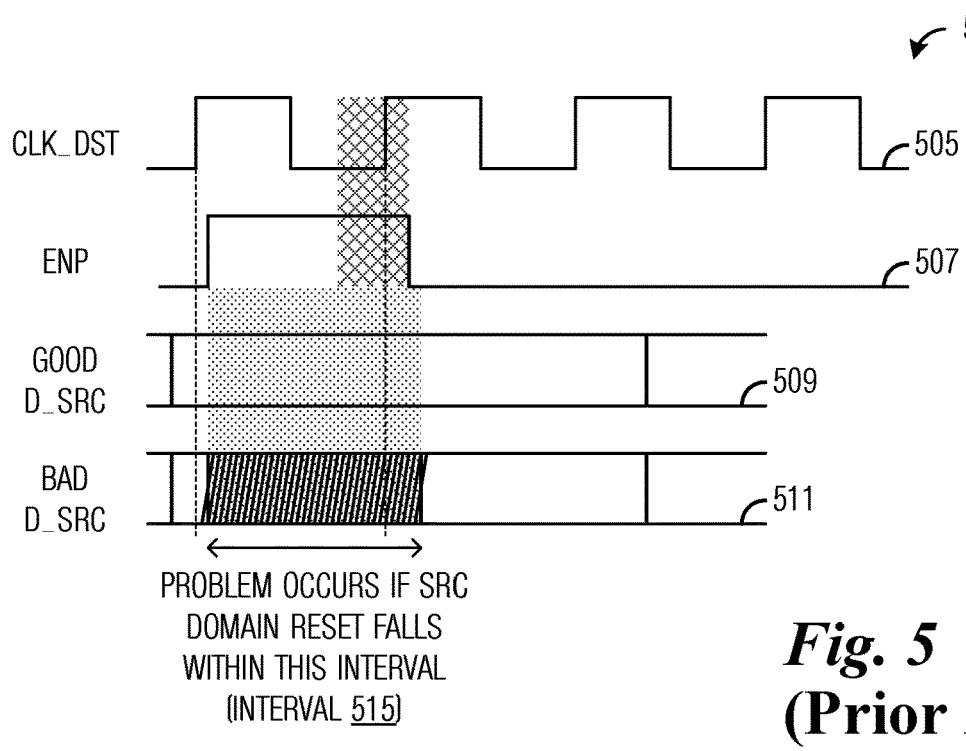
FIG. 5 illustrates a timing diagram highlighting a scenario potentially leading to a metastability condition in the prior art system of FIG. 4 as identified by the inventors of this application.

FIG. 5 illustrates a timing diagram 500 highlighting a scenario potentially leading to a metastability condition in the prior art system 400 of FIG. 4 as identified by the inventors of this application. Timing diagram 500 displays traces representing a clock of second clock domain 407 (trace 505), output (ENP) of XOR logic gate 432 (trace 507), a good output of flip-flops 412 (trace 509), and a bad output of flip-flops 412 (trace 511). If first reset signal (RST_B) 415 asserts within interval 515, flip-flops 422 may enter the metastability condition. This may be due to violation of setup or hold boundary of flip-flops 422, hence leading to subsequent circuitry becoming metastable or using corrupted values.

Techniques for dealing with clock domain crossing issues, such as recirculation muxes or handshake synchronizers, may fail in situations when the reset of both clock domains occur at different times (more specifically, when the source domain reset may be asserted independently of the destination domain reset). The failure may result in metastability and the propagation thereof, leading to eventual failure in the function of the system. Therefore, there is a need for methods and apparatus for data synchronization in systems with multiple clock and reset domains.

According to an embodiment, methods and apparatus for data synchronization in systems with multiple clock and reset domains are provided. The methods and apparatus provided herein are operable in systems with any digital design domain with multiple clock domains and where reset domains of the multiple clock domains are different.

In an embodiment, data from a source clock domain is reset by a reset signal of a destination clock domain. The data from the source clock domain, as stored in circuitry storing the data (e.g., the circuitry comprises one or more flip-flops, with the number of flip-flops being dependent upon the width of the data bus), may be reset when the reset signal of the destination clock domain becomes a specified value. Resetting the data from the source clock domain using a reset signal (e.g., a power on reset (POR_B) signal) of the destination clock domain helps to prevent any change in the data from occurring while the data is being sampled in the destination clock domain because the reset signal is originating from the destination clock domain. As an example, when the reset signal of the destination clock domain is active the data from the source clock domain is reset, while when the reset signal of the destination clock domain is inactive the data from the source clock domain is not reset, even when the reset of the source clock domain becomes active (e.g., goes to logic zero value).

In an embodiment, the sampling of the data from the source clock domain is synchronized in accordance with a reset signal of the source clock domain. The sampling of the data from the source clock domain by circuitry in the destination clock domain is synchronized with the source clock domain by a reset signal (e.g., a reset (RST_B) signal) of the source clock domain. As an example, when the reset signal of the source clock domain is inactive (e.g., the reset signal of the source clock domain is a logic one value) the circuitry in the destination clock domain samples the data from the source clock domain (e.g., the circuitry comprises one or more flip-flops, with the number of flip-flops being dependent upon the width of the data bus), while when the reset signal of the source clock domain is active (e.g., the reset signal of the source clock domain becomes a logic zero value) the circuitry in the destination clock domain does not sample the data from the source clock domain.

Figure 6:
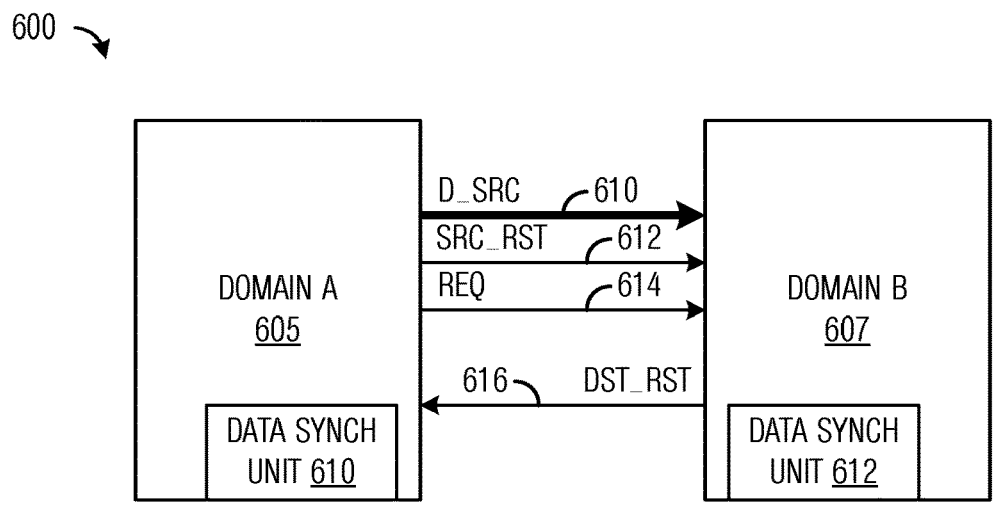
FIG. 6 illustrates a high-level view of a system with multiple clock domains, highlighting signals crossing the multiple clock and reset domains according to an embodiment presented herein.

FIG. 6 illustrates a high-level view of a system 60o with multiple clock domains, highlighting signals crossing the multiple clock and reset domains in accordance with an embodiment of the disclosure. As shown in FIG. 6, system 600 includes two clock domains (domain A 605 and domain B 607), with domain A 605 being the source clock domain and domain B 607 being the destination clock domain. Signals flowing from domain A 605 to domain B 607 include data signals (D_SRC) 610, a source reset signal (SRC_RST) 612, and a request signal (REQ) 614. A signal flow from domain B 607 to domain A 605 includes a destination reset signal (DST_RST) 616. Although domain A 605 and domain B 607 are shown in FIG. 6 as the source domain and the destination domains, domain A 605 and domain B 607 may also be the destination domain and the source domain, respectively, for different data signals. In this reversed situation, the directions of the signals shall be reversed.

Destination reset signal (DST_RST) 616, provided by domain B 607, may be used to reset data from domain A 605 that is stored in data synchronization unit 61o. Resetting the data from domain A 605 using destination reset signal (DST_RST) 616 helps to prevent changes in the data within domain A 605 from occurring while the data is being sampled in domain B 607.

The sampling of data from domain A 605, in domain B 607, is synchronized with source reset signal (SRC_RST) 612, which is provided by domain A 605. As an example, when source reset signal (SRC_RST) 612 is active, data synchronization unit 612 samples the data from domain A 605. Synchronizing the sampling of the data in domain B 607 with source reset signal (SRC_RST) 612 also helps to prevent changes in the data within domain A 605 while the data is being sampled in domain B 607.

System 600 also includes data synchronization units, with data synchronization unit 610 being associated with domain A 605 and data synchronization unit 612 being associated with domain B 607. The data synchronization units include circuitry associated with the methods and apparatus for data synchronization in systems with multiple clock and reset domains. The circuitry includes flip-flops, and logic gates, for example. In an embodiment, data synchronization units 610 and 612 include circuitry for providing data synchronization in systems with multiple clock and reset domains when domain A 605 is the source domain and domain B 607 is the destination domain. In other words, data synchronization units 610 and 612 include circuitry for providing data synchronization when only domain A 605 is the source domain and domain B 607 is the destination domain. As an example, data synchronization unit 610 includes circuitry for providing data synchronization in systems with multiple clock and reset domains with domain A 605 being the source domain, and data synchronization unit 612 includes circuitry for data synchronization in systems with multiple clock and reset domains with domain B 607 being the destination domain.

In another embodiment, data synchronization units 610 and 612 include circuitry for providing data synchronization in systems with multiple clock and reset domains when domain A 605 is either the source domain or the destination domain and domain B 607 is either the destination domain or the source domain. In other words, data synchronization units 610 and 612 include circuitry for providing data synchronization when domain A 605 or domain B 607 can be either the source domain or the destination domain. As an example, data synchronization unit 610 and data synchronization unit 612 each includes circuitry for providing data synchronization in systems with multiple clock and reset domains. A detailed discussion of example embodiments of the data synchronization units is provided below.

Figure 7:
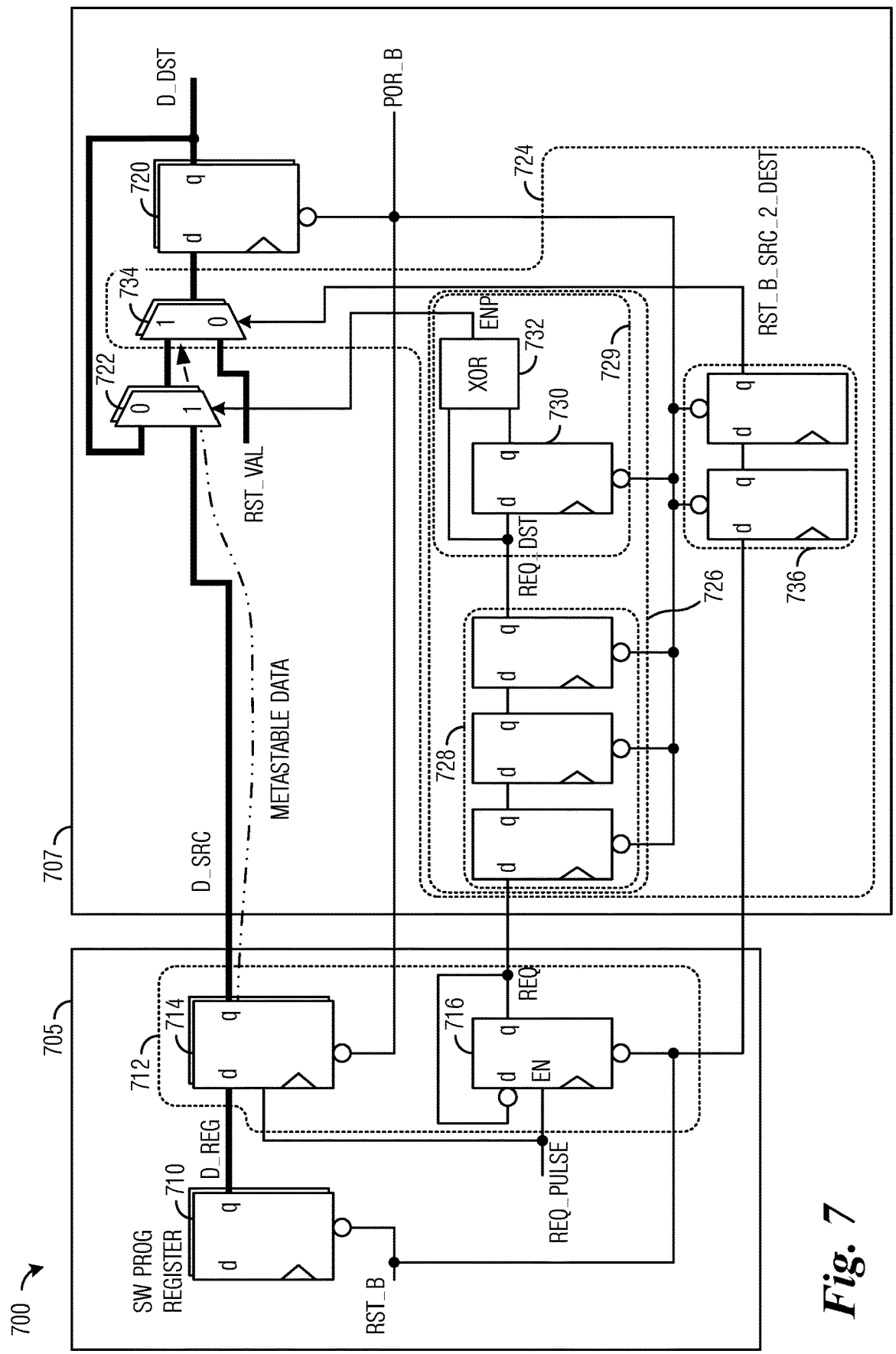
FIG. 7 illustrates a detailed view of a system highlighting a data synchronization unit according to an embodiment presented herein.

FIG. 7 illustrates a detailed view of a system 700 highlighting a data synchronization unit in accordance with an embodiment of the disclosure. System 700 includes two clock domains (clock domain 705 and clock domain 707), with clock domain 705 being the source domain and clock domain 707 being the destination domain. As shown in FIG. 7, circuitry in the destination domain (clock domain 707) samples data in the source domain (clock domain 705). The two clock domains include circuitry, i.e., data synchronization units, to provide data synchronization in system 700.

Circuitry in the source domain includes a SW programmable register (implemented as flip-flops, for example) 710 that stores data that is sampled by circuitry in the source domain. In other words, SW programmable register 710 stores the data that will be sampled by the destination domain and will cross the clock domains. SW programmable register 710 may store whatever value provided at its input.

Circuitry in the source domain also includes a data synchronization unit 712 that includes circuitry providing data synchronization for the source domain. Data synchronization unit 712 includes flip-flops 714 that samples and holds the data stored in SW programmable register 710, and a flip-flop 716 that generates and holds a request signal (REQ) that enables recirculation muxes 722 in the destination domain, selecting either an output of flip-flops 714 or a value of flip-flops 720 (the sampled value of the data of the source domain) depending upon the value of the request signal (REQ). The request signal (REQ) may be generated from request enable signal (REQ_PULSE), for example.

Input to flip-flops 714 is referred to as the value (DREG) stored in SW programmable register 710 and output of flip-flops 714 is referred to as the data (D_SRC) of the source domain. Flip-flops 714 are enabled by request enable signal (REQ_PULSE). The request enable signal (REQ_PULSE) is typically generated when data is written to SW programmable register 710, and indicates that the data can be synchronized in the destination domain. When enabled by the request enable signal (REQ_PULSE), flip-flops 714 sample the value stored in SW programmable register 710, and when not enabled by the request enable signal (REQ_PULSE), flip-flops 714 maintain their current value. Flip-flop 716 toggles between zero and one values of the request signal (REQ) when enabled by the request enable signal (REQ_PULSE). When not enabled by request enable signal (REQ_PULSE), flip-flop 716 maintains the current value of the request signal (REQ).

SW programmable register 710 and flip-flop 716 may be reset by reset signal (RST_B), which is a reset signal of the source domain. When the reset signal (RST_B) is active, SW programmable register 710 and flip-flop 716 are reset to default values, which may be defined by an operator of system 700 or a technical standard governing operation of system 700. Flip-flops 714 may be reset by reset signal (POR_B), which is a reset signal of the destination domain. When the reset signal (POR_B) is active, flip-flops 714 are reset. Flip-flops 714 being reset by a reset signal of the destination domain allows the destination domain knowledge and control of when flip-flops 714 are stable, thereby preventing violation of the setup or hold boundary the destination domain. Flip-flops 714 and flip-flop 716 make up data synchronization unit 712 of the source domain.

Circuitry in the destination domain includes flip-flops 720 that stores data that is sampled from the source domain. Circuitry in the destination domain also includes recirculation muxes 722 that operate in a manner similar to recirculation muxes 420 of FIG. 4 described previously.

Circuitry in the destination domain also includes a data synchronization unit 724 that includes circuitry providing data synchronization for the destination domain. Data synchronization unit 724 includes a request signal path 726 that propagates the request signal (REQ) outputted by flip-flop 716, and a reset path 736 that propagates the reset signal (RST_B) to select either the sampled value of flip-flops 714 or the reset values of SW programmable register 710 (RST_VAL). The reset values of SW programmable register 710 may be a pre-specified or pre-defined value that is loaded into SW programmable register 710 when SW programmable register 710 is reset. The reset values are available to system 700 in the form of a parameter or is hardcoded in system 700.

Request signal path 726 includes a synchronizer 728 that synchronizes the request signal (REQ) in the destination domain. Synchronizer 728 is implemented as a linear sequence of flip-flops (three flip-flops in this example embodiment but other numbers of flip-flops may be used). Due to the flip-flops in synchronizer 728, the request signal (REQ) is delayed by a first specified amount. The delay imparted onto the request signal (REQ) may be a function of the number of flip-flops, as well as the clock rate of the destination domain. Request signal path 726 also includes a pulse generator 729 (comprising a flip-flop 730 and an XOR logic gate 732) used to generate an enable signal (ENP) for recirculation muxes 722. In this example embodiment, the enable signal (ENP) is active for one cycle of the clock of the destination domain. The combination of flip-flop 730 and XOR logic gate 732 produces an active value when there is a change in the state of the request signal (REQ_DST) in consecutive clock cycles. If there is no change in the request signal (REQ_DST) in consecutive clock cycles, an inactive value is produced. If the enable signal (ENP) is active, recirculation muxes 722 output the output of flip-flops 714, while if the enable signal (ENP) is inactive, recirculation muxes 722 output the output of flip-flops 720 (the data in the destination domain (D_DST)).

Reset path 736 synchronizes the reset signal (RST_B) in the destination domain, and produces a synchronized reset signal (RST_B_SRC_2_DEST). Reset path 736 is implemented as a linear sequence of flip-flops. Due to the flip-flops in reset path 736, the reset signal (RST_B) is delayed by a second specified amount. The delay imparted onto the reset signal (RST_B) may be a function of the number of flip-flops, as well as the clock rate of the destination domain. As shown in FIG. 7, reset path 736 is implemented with two flip-flops. However, other numbers of flip-flops may be used. Output of reset path 736 (synchronized reset signal (RST_B_SRC_2_DEST)) is provided to muxes 734 to select from either the output of recirculation muxes 722 (the sampled output of flip-flops 714 or output of flip-flops 720) or the reset value of SW programmable register 710 (RST_VAL), which is available in the form of a hard-coded parameter, for example.

Because reset path 736 is implemented with two flip-flops and synchronizer 728 of request signal path 726 is implemented with three flip-flops, the delay associated with reset path 736 is smaller than the delay associated with request signal path 726. Hence, a change to the reset signal (RST_B) will arrive at muxes 734 before a change to the request signal (REQ) arrives at recirculation muxes 722. Therefore, the reset signal (RST_B) may be used to select (utilizing muxes 734) the reset value of SW programmable register 710 to output while the sampled data (the output of flip-flops 714) may be metastable. If the reset signal (RST_B) is inactive, muxes 734 will select the output of recirculation muxes 722, which will in turn sample the data from the source domain once the request signal (REQ) has reached the destination domain in a synchronized fashion. Because the request signal (RST_B) is inactive, there is no chance that the output of flip-flops 714 violating the setup or hold boundary of flip-flops 720.

Due to cycle uncertainty in multi-flop synchronizers (as discussed previously), it is possible that the reset signal (RST_B) takes three cycles of the clock of the destination domain to become synchronized to the destination domain instead of two cycles of the clock of the destination domain. Therefore, there is a possibility that recirculation muxes 722 are unaware of a potentially metastable data (D_SRC) at about the same time as muxes 734 transparent to the reset values (RST_VAL). However, because muxes 734 is located after recirculation muxes 722 in the data path, it is ensured that even if the delay incurred by the reset signal (RST_B) is about equal to the delay incurred by the request signal (REQ), flip-flops 720 capture the reset values (RST_VAL) instead of the output of recirculation muxes 722.

The flip-flops of the destination domain (i.e., flip-flops 720, and the flip-flops in synchronizer 728 and reset path 736) are reset by the reset signal (POR_B), as is flip-flops 714, so the destination domain controls the sampling and propagation of the sampled data from the source domain to the destination domain.

When the reset signal (RST_B) of the source domain is asserted, there is a possibility that flip-flops 714 become metastable. This may be possible because flip-flops 714 are reset by the reset signal (POR_B) of the destination domain and not asynchronously reset by the reset signal (RST_B), and the output of SW programmable register 710 may not meet the setup or hold boundary for flip-flops 714. As an example, this situation may occur when the request enable signal (REQ_PULSE) is active (thereby enabling flip-flops 714) and the reset signal (RST_B) is asserted too close to an active edge of the clock of the source domain, and thus, the data input of flip-flops 714 change within the setup or hold boundary of flip-flops 714. Because flip-flops 714 are not in a reset state, they may sample the unstable data at their inputs, leading to a metastable output at the output of flip-flops 714. The metastability condition of flip-flops 714 may propagate to flip-flops 720. However, the propagation does not occur until the request signal (REQ) reaches the destination domain and enables recirculation muxes 722 (in the form of the enable signal (ENP)). As an example, the previous value of the request signal (REQ) may be a logic 1, and due to the assertion of the reset signal (RST_B), the request signal (REQ) toggles, becoming a logic 0. This change in the request signal (REQ) may be captured in the destination domain, leading to the generation of the enable signal (ENP). In an embodiment, the design of synchronizer 728 and reset path 736 is such that the propagation, in the destination domain, of the request signal (REQ) is slower than the propagation of the reset signal (RST_B). Therefore, the reset value (RST_VAL) of SW programmable register 710 rather than the output of flip-flops 714 is routed to flip-flops 720.

Figure 8:
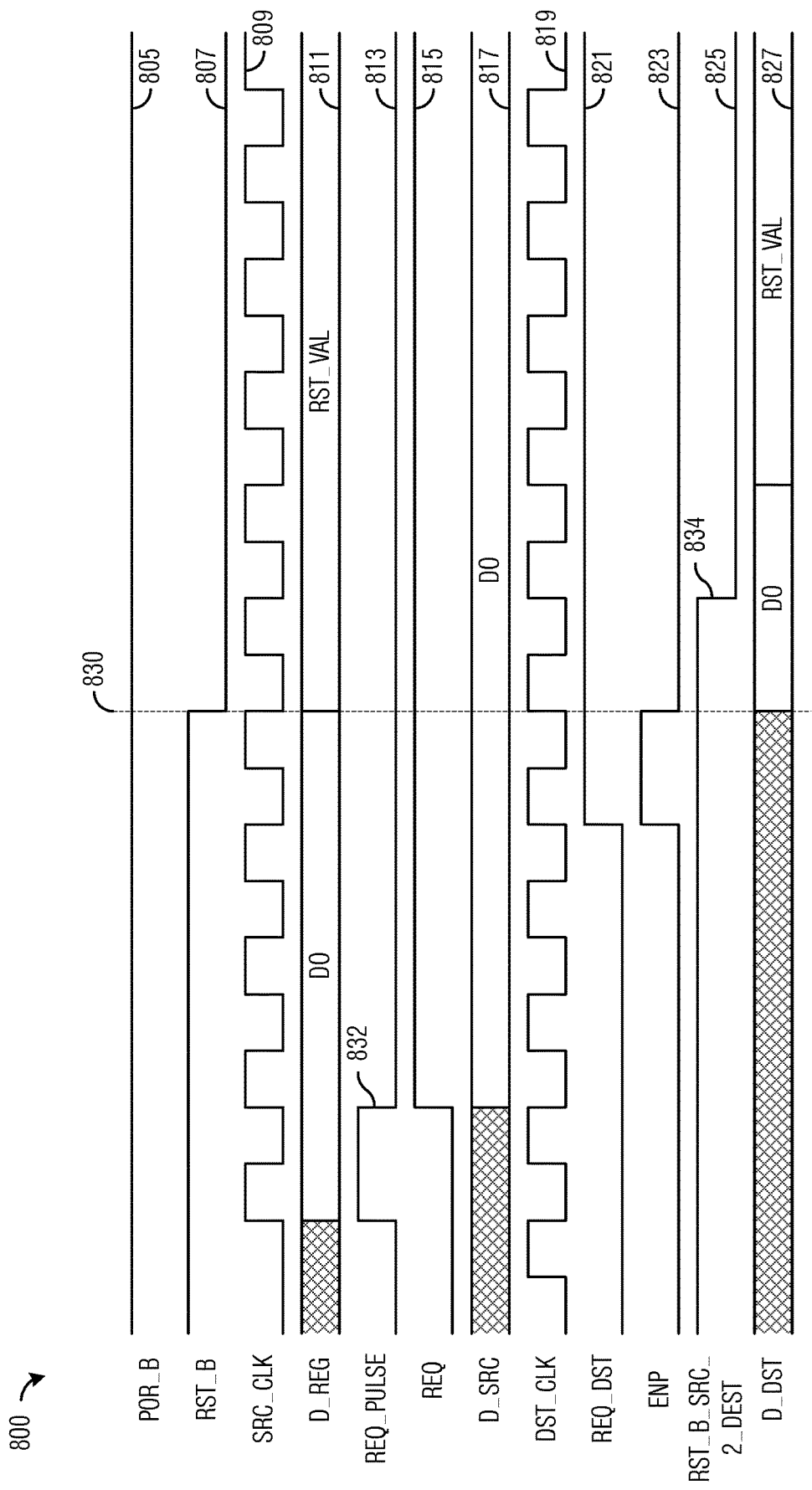
FIG. 8 illustrates a timing diagram of the system of FIG. 7 displaying a first example data clock domain crossing according to an embodiment presented herein.

FIG. 8 illustrates a timing diagram 800 of system 700 of FIG. 7 displaying a first example data clock domain crossing in accordance with an embodiment of the disclosure. The signal names shown in timing diagram 800 correspond to signal names illustrated in FIG. 7, where trace 805 represents the reset signal (POR_B) in the destination domain, trace 807 represents the reset signal (RST_B) in the source domain, trace 809 represents the clock (SRC_CLK) of the source domain, trace 811 represents the data (DREG) of SW programmable register 710 (a multi-valued signal), trace 813 represents the request enable signal (REQ_PULSE), trace 815 represents the output (request signal (REQ)) of flip-flop 716, trace 817 represents the sampled data (D_SRC) of flip-flops 714 (a multi-valued signal), trace 819 represents the clock (DST_CLK) of the destination domain, trace 821 represents the synchronized request signal (REQ_DST), trace 823 represents the enable signal (ENP), trace 825 represents the synchronized reset signal (RST_B_SRC_2_DEST), and trace 827 represents the data (D_DST) in the destination domain (a multi-value signal).

As shown in FIG. 8, the reset signal (RST_B) is asserted at time 830, resulting in SW programmable register 710 being reset and the reset value (RST_VAL) being loaded into SW programmable register 710. However, the request enable signal (REQ_PULSE) is inactive, flip-flops 714 maintain the pre-reset value ("Do") of flip-flop 710, which was sampled by flip-flops 714 when last enabled (during active high level 832 of request enable signal (REQ_PULSE), for example).

Because the sample data (D_SRC) has not been reset by the reset signal (POR_B) nor are flip-flops 714 been enabled by the request enable signal (REQ_PULSE), the sampled data (D_SRC) is not consistent with the data (DREG), the active high level of the enable signal (ENP) results in recirculation muxes 722 selecting the sampled data (D_SRC) to output, hence the data (D_DST) takes on the value "Do" from flip-flops 714. However, at falling edge 834 of the synchronized reset signal (RST_B_SRC_2_DEST), muxes 734 select the reset value (RST_VAL) to output, hence changing the data (D_DST) to the reset value (RST_VAL) at a subsequent edge of the clock (DST_CLK).

Figure 9:
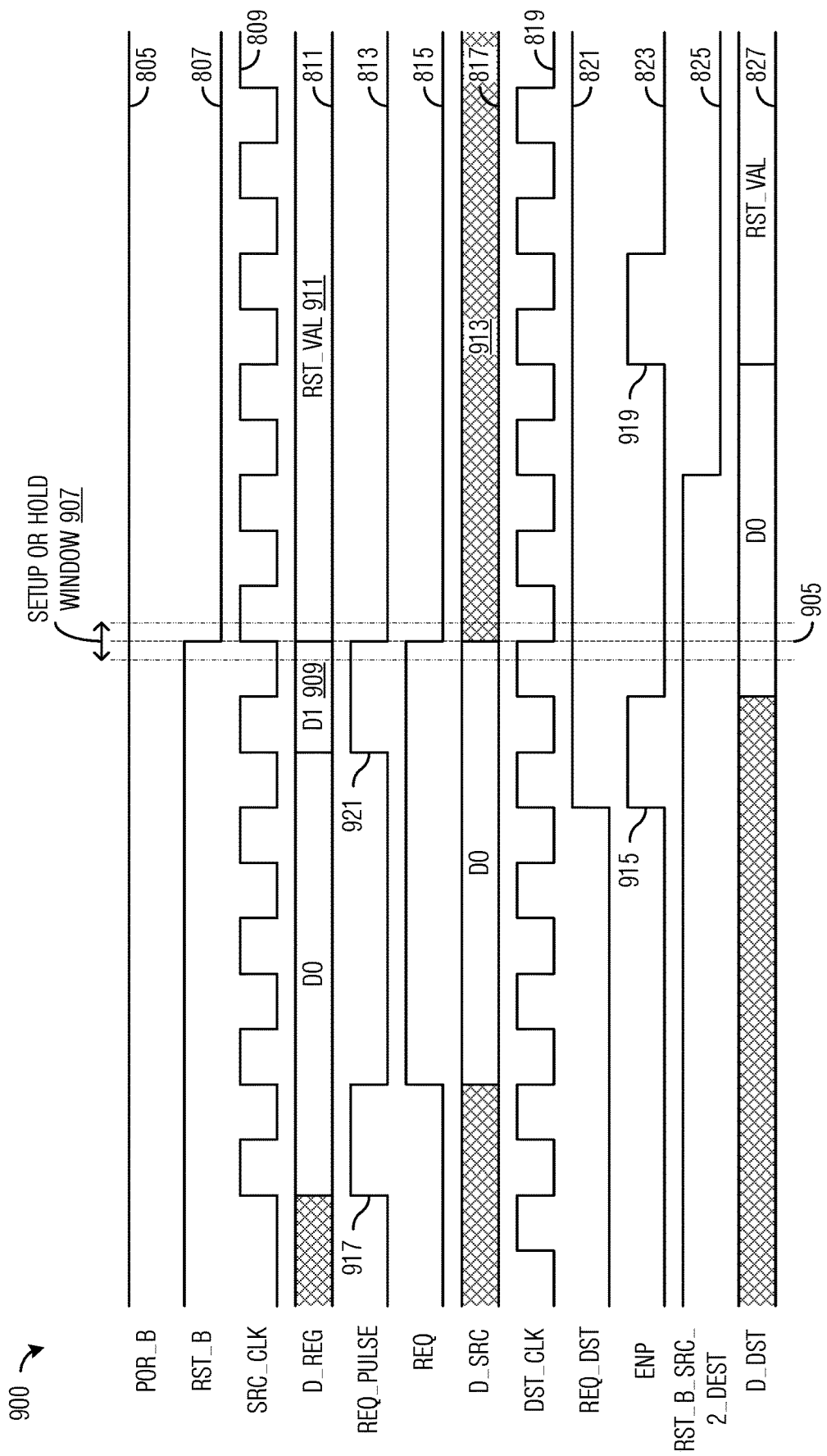
FIG. 9 illustrates a timing diagram of the system of FIG. 7 displaying a second example data clock domain crossing according to an embodiment presented herein.

FIG. 9 illustrates a timing diagram 900 of system 700 of FIG. 7 displaying a second example data clock domain crossing in accordance with an embodiment of the disclosure. The signal names shown in timing diagram 900 correspond to signal names illustrated in FIG. 7.

As shown in FIG. 9, the reset signal (RST_B) is asserted at about time 905, resulting in SW programmable register 710 being reset and the reset value (RST_VAL) being loaded into SW programmable register 710. In digital circuits, an input to a flip-flop typically has to meet the setup or hold requirement of the flip-flop to ensure that the flip-flop takes on a value commensurate with the input. The setup or hold requirement is illustrated for flip-flop 714 as "Setup or Hold" window 907, meaning that the input to flip-flops 714 should be relatively stable within window 907 to ensure that flip-flops 714 accurately captures the value at the input and does not become metastable.

However, as shown in FIG. 9, the input to flip-flops 714 (the data (D_REG)) has value Di 909 prior to time 905 and value RST_VAL 911 after time 905, with a value change at about time 905. Hence, the input to flip-flops 714 does not meet the setup or hold requirement within window 907. As a result, flip-flops 714 become metastable 913 after time 905.

Logic 1 level 915 of the enable signal (ENP), corresponding to the request enable signal (REQ_PULSE) 917, causes recirculation muxes 722 to pass the D_SRC data (Do) from flip-flops 714 to its output, resulting in data (D_DST) 827 to change to Do. A second pulse 921 of the request enable signal (REQ_PULSE) is generated at about time 905, at about the same time as the reset signal (RST_B) is asserted. Because the reset path delay is shorter than the request path delay, the muxes 734 sample the reset values (RST_VAL) of the source data instead of the metastable value 913 of D_SRC 817. This leads to the data (D_DST) changing to the reset values (RST_VAL).

According to an embodiment, a data synchronization unit is provided as an interface between clock domains of a system whenever data crosses the clock domains. Whenever data crosses from a source domain to a destination domain, a data synchronization unit provides circuitry to ensure that a metastability condition does not propagate into the destination domain. In an embodiment, a data synchronization unit is provided for each direction of data flow between any two clock domains. As an example, if data flows only in one direction (e.g., from a first clock domain to a second clock domain), a single data synchronization unit is sufficient. As an example, if data flows in both directions (e.g., from the first clock domain to the second clock domain and from the second clock domain to the first clock domain), a first data synchronization unit is used to ensure that a metastability condition does not propagate into the second clock domain (due to the data from the first clock domain) and a second data synchronization unit is used to ensure that a metastability condition does not propagate into the first clock domain (due to the data from the second clock domain).

Figure 10A:
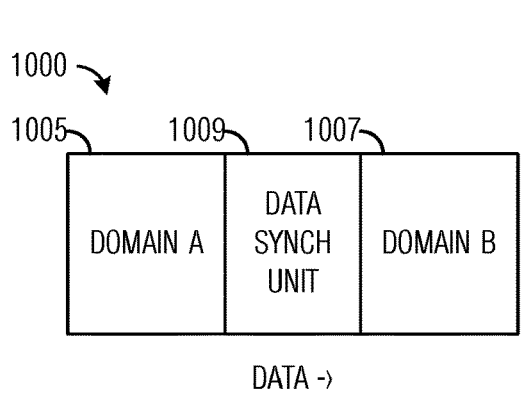
FIG. 10A illustrates a system highlighting an uni-directional data clock domain crossing according to an embodiment presented herein.

FIG. 10A illustrates a system 1000 highlighting an unidirectional data clock domain crossing in accordance with an embodiment of the disclosure. System 1000 includes domain A 1005 and domain B 1007, with data crossing clock domains only from domain A 1005 to domain B 1007. System 1000 also includes a data synchronization unit 1009 that ensures that a metastability condition does not propagate into domain B 1007.

Figure 10B:
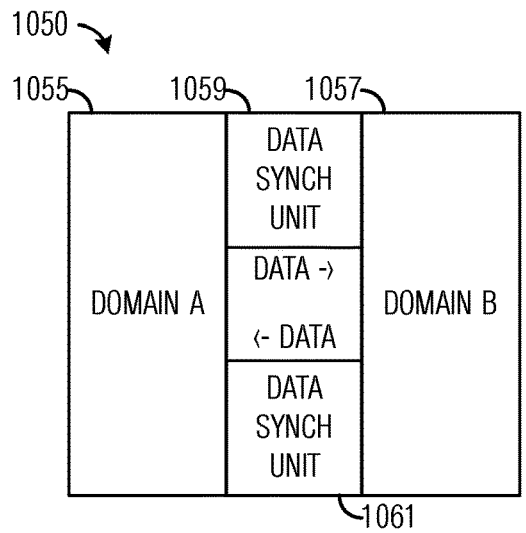
FIG. 10B illustrates a system highlighting a bi-directional data clock domain crossing according to an embodiment presented herein.

FIG. 10B illustrates a system 1050 highlighting a bi-directional data clock domain crossing in accordance with an embodiment of the disclosure. System 1050 includes domain A 1055 and domain B 1057, with data crossing clock domains from domain A 1055 to domain B 1057, as well as from domain B 1057 to domain A 1055. System 1050 also includes a first data synchronization unit 1059 that ensures that a metastability condition does not propagate into domain B 1057, as well as a second data synchronization unit 1061 that ensures that a metastability condition does not propagate into domain A 1055.

In an embodiment, in a system with more than two clock domains, data synchronization units are present between any two clock domains where there is data crossing clock domains.

Figure 11A:
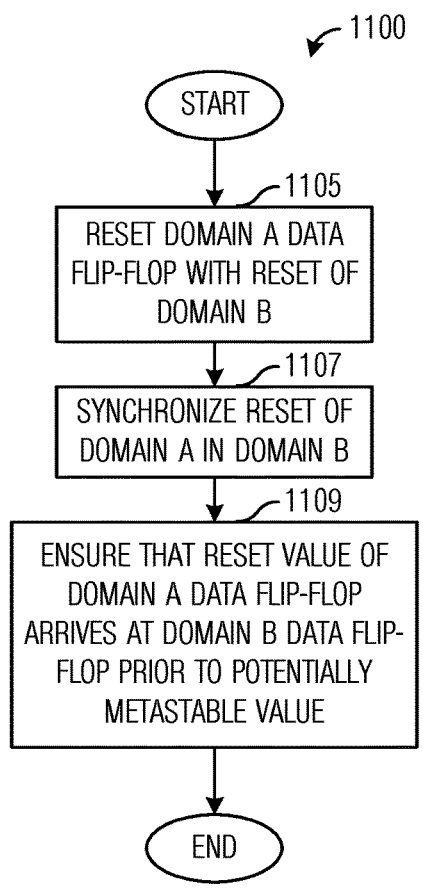
FIG. 11A illustrates a flow diagram of example operations occurring in a system with multiple clock and reset domains according to an embodiment presented herein.

FIG. 11A illustrates a flow diagram of example operations 1100 occurring in a system with multiple clock and reset domains in accordance with an embodiment of the disclosure. Operations 1100 may be indicative of operations occurring in a system with multiple clock and reset domains.

Operations 1100 begin with a resetting of data flip-flops in domain A with a reset signal from domain B (block 1105). The resetting of the data flip-flops in domain A with the reset signal from domain B ensures that the destination domain data flip-flops do not become metastable when circuitry in domain B is sampling the data in domain A. A reset from domain A is synchronized in domain B (block 1107). The domain A reset is synchronized in domain B to help ensure that domain B knows when to sample the reset value of the source data from domain A. However, to help prevent the propagation of the metastable value, the reset value of the data flip-flops in domain A arrives at the data flip-flops in domain B prior to the metastable value (block 1109). One way to ensure that the reset value arrives before the metastable value is to ensure that the request synchronization path in the destination domain has greater delay than the reset synchronization path in the destination domain.

Figure 11B:
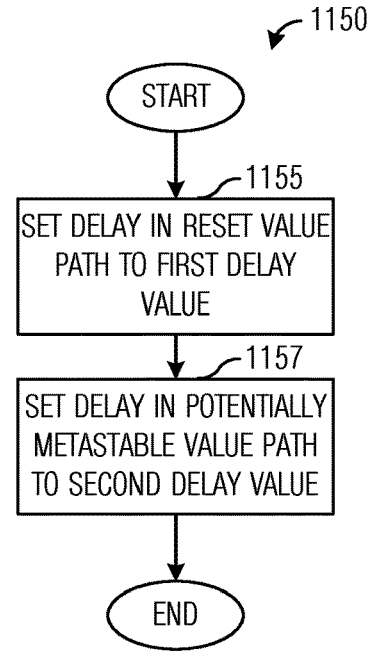
FIG. 11B illustrates a flow diagram of example operations occurring while ensuring that a reset value arrives at a data flip-flop before a metastable value according to an embodiment presented herein.

FIG. 11B illustrates a flow diagram of example operations 1150 occurring while ensuring that a reset value arrives at data flip-flops before a metastable value in accordance with an embodiment of the disclosure. Operations 1150 may be indicative of operations occurring in a system while the system ensures that a reset value arrives at data flip-flops before a metastable value.

Operations 1150 begin with setting a delay in a signal path of the reset value to a first delay value (block 1155). A delay in a signal path of a potentially metastable data value is set to a second value, where the first delay value is smaller than the second delay value (block 1157). The delay values may be set using flip-flops inserted into the signal paths, and a signal path with a larger number of flip-flops would have a larger delay than a signal path with a smaller number of flip-flops (assuming that the flip-flops are the same type of flip-flops manufactured using the same technology). In addition to inserting delays, the flip-flops in the signal paths may be used to synchronize the signals in the signal paths to the destination domain.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A data synchronization unit comprising:
    first flip-flops having an input for receiving data from a first clock domain, a reset coupled to a reset signal of a second clock domain, and an output for providing sampled data, the first flip-flops being enabled by a request enable signal;
    a second flip-flop having an input coupled to an inverted output of the second flip-flop, an output for providing a request signal, and a reset coupled to a reset signal of the first clock domain, the second flip-flop being enabled by the request enable signal;
    a request signal path having an input coupled to the request signal, and an output for providing an enable signal synchronized to the second clock domain, the request signal path being configured to synchronize and delay the request signal by a first delay and to generate the enable signal in accordance with the synchronized request signal;
    a synchronized reset signal path having an input coupled to the reset signal of the first clock domain, and an output for providing a synchronized reset signal, the synchronized reset signal path being configured to synchronize and delay the reset signal of the first clock domain by a second delay, wherein the second delay is shorter than the first delay; and
    multiplexers having first inputs for receiving outputs of recirculation multiplexers, second inputs for receiving a reset value of a programmable register, a select input for receiving the synchronized reset signal, the multiplexers being configured to selectively output signals at inputs of the multiplexers to outputs of the multiplexers.

2. The data synchronization unit of claim 1, wherein the request signal path comprises three serially coupled flip-flops, with each flip-flop having a reset coupled to the reset signal of the second clock domain.

3. The data synchronization unit of claim 2, wherein the request signal path further comprises a fourth flip-flop having an input coupled to the three serially coupled flip-flops; and a logic gate having a first input for receiving an output of the fourth flip-flop, a second input for receiving an output of the three serially coupled flip-flops, and an output for providing a single cycle pulse in response to detecting the request signal toggling state.

4. The data synchronization unit of claim 3, wherein the logic gate comprises an exclusive-OR logic gate.

5. The data synchronization unit of claim 3, wherein the fourth flip-flop comprises a reset coupled to the reset signal of the second clock domain.

6. The data synchronization unit of claim 3, wherein the three serially coupled flip-flops and the fourth flip-flop are clocked by a clock of the second clock domain.

7. The data synchronization unit of claim 1, wherein the synchronized reset signal path comprises two serially coupled flip-flops, with each flip-flop having a reset coupled to the reset signal of the second clock domain.

8. The data synchronization unit of claim 1, wherein the first and second flip-flops are "D" flip-flops.

9. The data synchronization unit of claim 1, wherein the first and second flip-flops are clocked by a clock of the first clock domain.

10. The data synchronization unit of claim 1, wherein the reset signal of the first clock domain and the reset signal of the second clock domain are different reset signals.

11. The data synchronization unit of claim 1, wherein the reset value of the programmable register is a hardcoded parameter.

12. A system comprising:
    a first clock domain circuit having an output for providing data clocked by a clock of a first clock domain;
    a second clock domain circuit having an input for receiving data from the first clock domain circuit, the received data being clocked by a clock of a second clock domain; and
    a data synchronization circuit operatively coupled in between the first clock domain circuit and the second clock domain circuit, the data synchronization circuit being configured to synchronize a reset signal of the first clock domain to the second clock domain and to prevent propagation of a metastable value into the second clock domain circuit.

13. The system of claim 12, wherein the data synchronization circuit comprises:
   first flip-flops having an input for receiving data from the first clock domain circuit, a reset coupled to a reset signal of the second clock domain, and an output for providing sampled data, the first flip-flops being enabled by a request enable signal;
   a second flip-flop having an input coupled to an inverted output of the second flip-flop, an output for providing a request signal, and a reset coupled to the reset signal of the first clock domain, the second flip-flop being enabled by the request enable signal;
   a request signal path having an input coupled to the request signal, and an output for providing an enable signal synchronized to the second clock domain, the request signal path being configured to synchronize and delay the request signal by a first delay and to generate the enable signal in accordance with the synchronized request signal;
   a synchronized reset signal path having an input coupled to the reset signal of the first clock domain, and an output for providing a synchronized reset signal, the synchronized reset signal path being configured to synchronize and delay the reset signal of the first clock domain by a second delay, wherein the second delay is shorter than the first delay; and
   multiplexers having first inputs for receiving outputs of recirculation multiplexers, second inputs for receiving a reset value of a programmable register, a select input for receiving the synchronized reset signal, the multiplexers being configured to selectively output signals at inputs of the multiplexers to outputs of the multiplexers.

14. The system of claim 13, wherein the request signal path comprises three serially coupled flip-flops, with each flip-flop having a reset coupled to the reset signal of the second clock domain.

15. The system of claim 14, wherein the request signal path further comprises a fourth flip-flop having an input coupled to the three serially coupled flip-flops; and an exclusive-OR gate having a first input for receiving an output of the fourth flip-flop, a second input for receiving an output of the three serially coupled flip-flops, and an output for providing the enable signal for the recirculation multiplexers, the enable signal being synchronized to the second clock domain.

16. The system of claim 13, wherein the synchronized reset signal path comprises two serially coupled flip-flops, with each flip-flop having a reset coupled to the reset signal of the second clock domain.

17. The system of claim 13, wherein the first and second flip-flops are clocked by the clock of the first clock domain.

18. A method comprising:
   synchronizing a reset of a first clock domain to a second clock domain; and
   ensuring that a synchronization and delay of a request signal from the first clock domain in the second clock domain is slower than a synchronization and delay of a reset of the first clock domain in the second clock domain.

19. The method of claim 18, further comprising resetting data sampling flip-flops in the first clock domain with a reset of the second clock domain.

20. The method of claim 18, the reset of the first clock domain and the reset of the second clock domain are different resets.

* * * * *